United States Patent [19]
Harumiya et al.

[11] 4,060,795
[45] Nov. 29, 1977

[54] SCANNING SYSTEM

[75] Inventors: Akinori Harumiya; Koki Toyosawa, both of Yokohama, Japan

[73] Assignee: Hitachi, Ltd., Japan

[21] Appl. No.: 715,158

[22] Filed: Aug. 17, 1976

Related U.S. Application Data
[63] Continuation-in-part of Ser. No. 444,565, Feb. 21, 1974, abandoned.

[30] Foreign Application Priority Data
Feb. 23, 1973  Japan .................................. 48-21293

[51] Int. Cl.² .................................................. G11C 11/40
[52] U.S. Cl. .................................. 364/900; 340/413; 365/189; 365/230
[58] Field of Search .............. 340/172.5, 173 R, 413, 340/166, 150

[56] References Cited
U.S. PATENT DOCUMENTS

| | | | |
|---|---|---|---|
| 3,543,267 | 11/1970 | Morris | 340/413 |
| 3,629,831 | 12/1971 | Mikus et al. | 340/151 X |
| 3,736,574 | 5/1973 | Gersbach | 340/173 R |
| 3,739,355 | 6/1973 | Radcliffe, Jr. | 340/173 R |
| 3,851,313 | 11/1974 | Chang | 340/173 R |
| 3,855,582 | 12/1974 | Roberts | 340/173 R X |

*Primary Examiner*—Edward J. Wise
*Attorney, Agent, or Firm*—Craig & Antonelli

[57] ABSTRACT

A scanning system is disclosed in which a multiplicity of points arranged in matrix are scanned column by column in accordance with the commands issued from a central controller, which scanning system comprises a memory and a scanning controller for scanning in sequence a plurality of the scanning points designated by the central controller and storing the results of the scanning in the memory sequentially. The information stored in the memory is read out from time to time by the central controller as required.

2 Claims, 5 Drawing Figures

SCANNING SYSTEM

CROSS-REFERENCES TO RELATED APPLICATION

This application is a continuation-in-part application of U.S. Pat. application Ser. No. 444,565 filed Feb. 21, 1974, now abandoned.

BACKGROUND OF THE INVENTION

1. Field of the Invention

The present invention relates to a scanning system or more in particular to a scanning system for scanning a multiplicity of points in matrix form column by column.

2. Description of the Prior Art

In the scanning system of this type, the access time, that is, the time interval from the time point when the columns of points to be scanned begin to be scanned until the time point when the information on such columns is obtained is long compared with the working time of the central controller, partly due to the delay time caused by a noise-eliminating filter of a sense-amplifier and partly due to the stray capacitance of a scanning drive line connecting the columns of points to be scanned to a scanning driver or a read line, that is, a bus connecting the columns to be scanned to the sense-amplifier, resulting in a lower efficiency of the central controller which suspends its operation during the access time.

A scanning device which requires a short access time, on the other hand, commonly uses a bus scanning system in which means are provided for preventing noise from being carried on the bus and for increasing the noise tolerance of the sense-amplifier without any noise-eliminating filter, thus leading to the disadvantage of a higher cost.

SUMMARY OF THE INVENTION

An object of the present invention is to provide a low-cost bus scanning system used with a scanning device requiring a short access time; wherein a multiplicity of points to be scanned are capable of being scanned by the efficient operation of a central controller without using an expensive scanning device short in access time.

A feature of the present invention resides in the fact that a scanning controller is inserted between a scanning matrix and a central controller, which controller receives a command from the central controller in each scanning cycle so that part of the columns of the points included in the matrix to be scanned is scanned and the results of the scanning are stored in a memory in that particular cycle. Thus, the central controller, once it has issued in each scanning cycle a command to scan the matrix, can attend to another job during the scanning period. Further, the scanning controller may complete the scanning operation at any time during a scanning cycle, thus alleviating the circuit requirements associated with the scanning operation.

In accordance with another aspect of the invention, the matrix of the points to be scanned is divided longitudinally into a plurality of submatrices which are scanned in different scanning cycles in accordance with corresponding scanning commands issued in sequence from the central controller to the scanning controller. In this way, the scanning controller can concentrate on one corresponding submatrix instead of the whole matrix in each scanning cycle, with the result that larger matrix can be scanned with an ample margin, thus further alleviating the circuit conditions.

DESCRIPTION OF THE PREFERRED EMBODIMENTS

Figure 1:
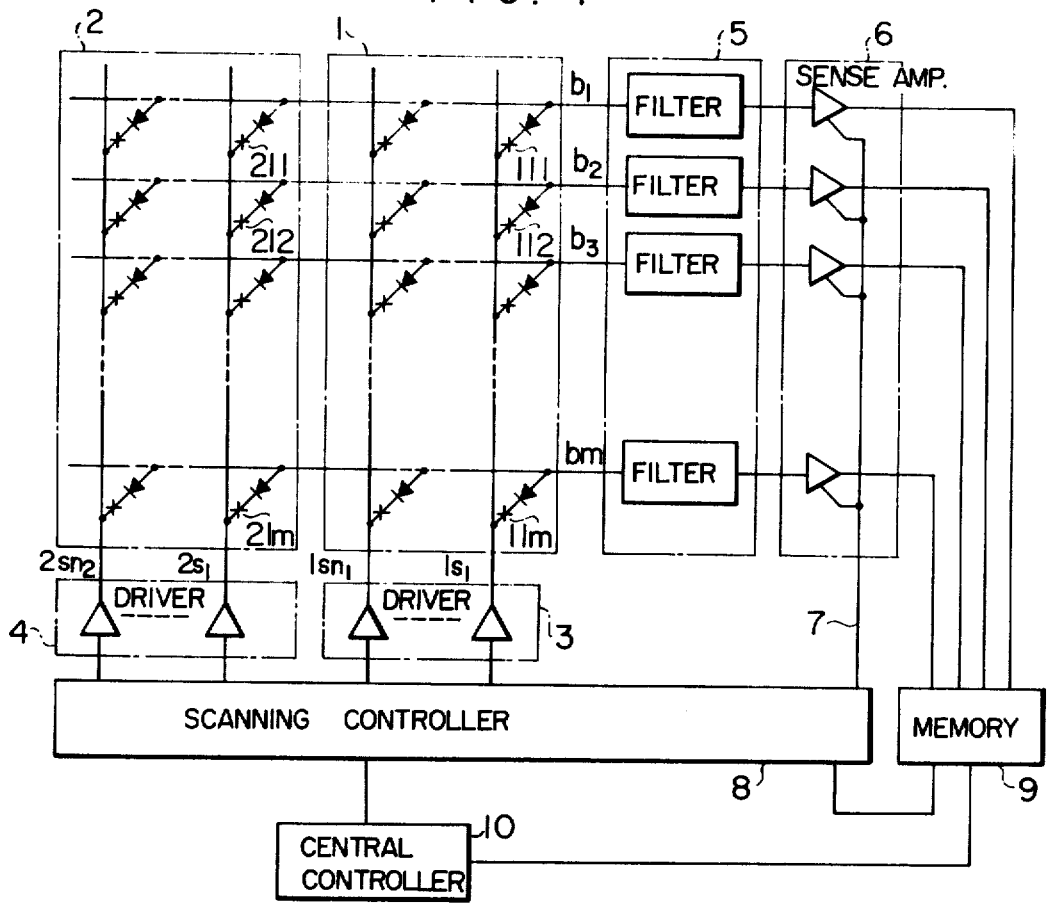
FIG. 1 is a block diagram showing the first embodiment of the present invention.

Referring to FIG. 1, symbols $x$ with reference numerals 111, 112 and so on show points to be scanned, or more specifically electronic or mechanical switches, which may be in either the "ON" or "OFF" state. Diodes respectively connected to the points to be scanned are for preventing current from being misrouted.

The points to be scanned which are arranged in a matrix are accomodated in a couple of submatrices, submatrix 1 and submatrix 2; the former contains those scanning points with a short scanning cycle, say, 8ms, and the latter includes scanning points with a long scanning cycle or non-cyclic scanning points. The $m$ buses $b_1$ to $b_m$ are common to both submatrices 1 and 2 and connected respectively to sense-amplifiers 6 through noise-eliminating filters 5. The $n_1$ scanning drive lines $1s_1$ to $1sn_1$ of the submatrix 1 are connected to a scanning driver circuit 3, while on the other hand $n_2$ scanning drive lines $2s_1$ to $2sn_2$ of the submatrix are coupled to a scanning driver circuit 4.

A scanning controller 8 controls the scanning driver circuit 4 as well as issues a strobe signal 7 to the sense-amplifiers 6 and to a memory 9 a control signal designating the address of the memory 9 where the scanned information is to be stored.

A central controller 10 issues scanning commands as well as uses the scanned information stored in the memory 9.

Such a central controller of accumulative program issuing commands to peripheral apparatus and exchanging information with a memory is well known in the field of a computor or an electronic exchange, and the device referred to as "common control" in U.S. Pat. No. 2,955,165 as it is can be used as a central controller.

When the central controller 10 issues to the scanning controller 8 a command to scan the submatrix 1, the scanning controller 8 begins to drive the first column of the submatrix 1, that is, the scanning drive line $1s_1$ through the scanning drive circuit 3. The information concerning the turning ON and OFF of the $m$ scanning points 111 to 11m in the first column of the submatrix 1 is introduced into the sense-amplifiers 6 through the respective noise-eliminating filters 5 corresponding to the buses $b_1$ to $b_m$. The scanning controller 8 continues to apply a signal to the first column of the drive circuit 3 until the scanned information of the first column is established in the sense-amplifiers 6. Upon the establishment of the scanned information by the sense-amplifiers 6 the scanning controller 8 issues a strobe signal 7 while at the same time designating that address of the memory 9 where the scanned information is to be stored.

As the next step, in order to begin the scanning of the second column of the submatrix 1, the scanning controller 8 stops issuing the signal so far issued to the first column of the scanning driver circuit 3 and instead begins to send a signal to the scanning drive line $1s_2$ of the second column. Subsequent processes similar to those mentioned above with reference to the first column also apply to the second column for the operation until the scanned information of the second column of the matrix 1 has been stored in the memory 9. The above-described steps are taken for all the subsequent columns until the $n_1$-th column is reached thereby to scan all the points to be scanned in the submatrix 1, and then the resulting scanned information is stored in the memory 9.

The whole operation of FIG. 1 has been generally explained and in order to further facilitate the understanding on the explanation, the operation of the scanning controller 8 having 16 columns shown in FIG. 2 will be explained in detail.

Figure 2:
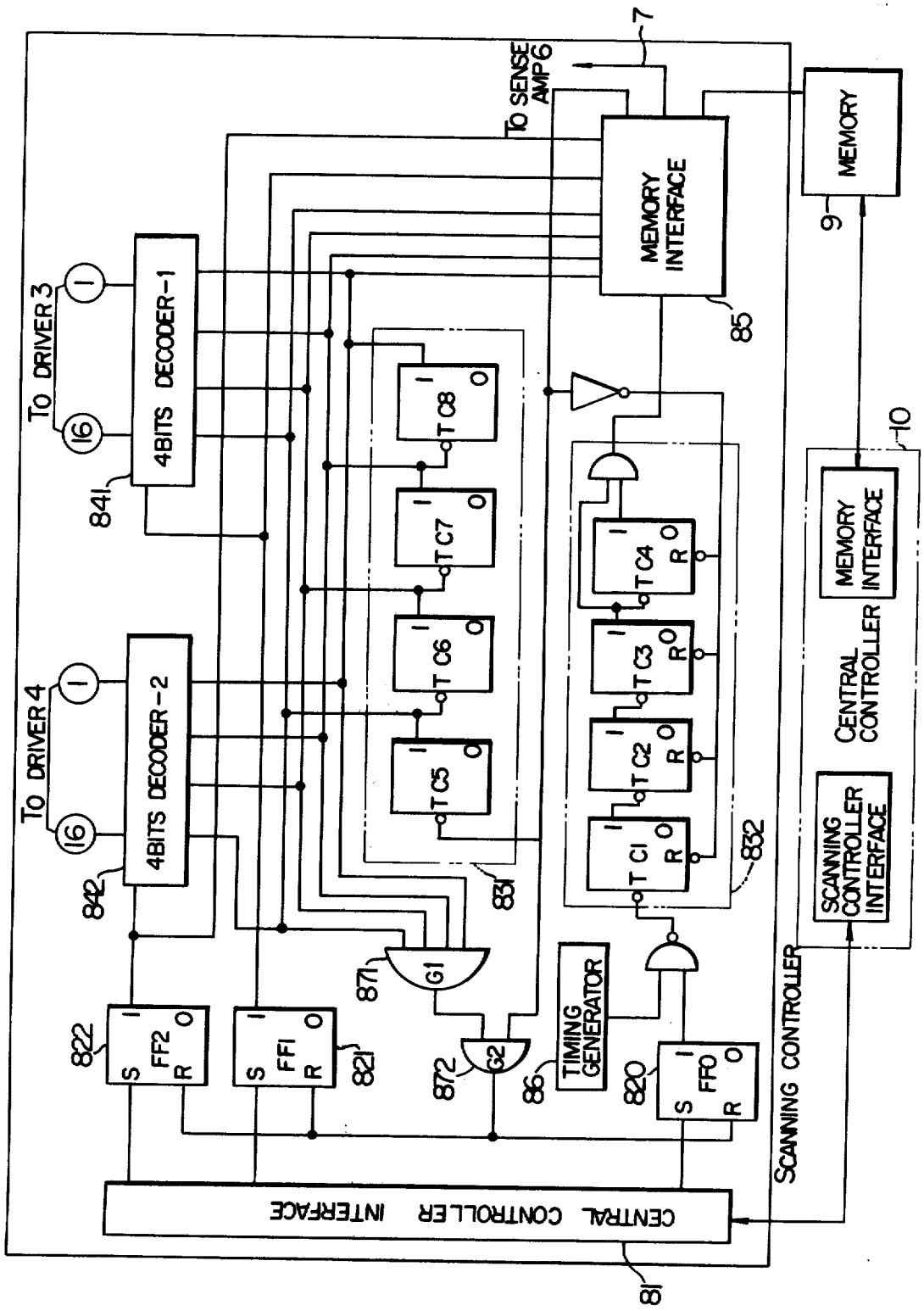
FIG. 2 in a block diagram showing the operation of one example of the scanning controller employed in the first embodiment.

The scanning controller, as seen from FIG. 2 is composed of an interface 81 connected with the central controller 10, flip-flop's 820 to 822 for preserving the information on the status of the scanning controller, which is connected with the interface 81 two kinds of counters 831 and 832, two decorders 841 and 842 each for decoding an output of the counter 831 a memory interface 85 and a timing generator 86.

The one counter 832 counts the time during when one scanning drive line is being driven while the other counter 831 advances in turn scanning drive lines to be driven.

The command to scan the submatrix 1 in FIG. 1 from the central controller 10 to the scanning controller is received and decoded by the central controller interface 81 in the scanning controller. As a result, the flip-flop 820 meaning the receipt of the scan-command is set and the flip-flop 821 meaning the scanning of the submatrix 1 is also set. Incidentally, the flip-flop 822 meaning the scanning of the submatrix 2 still remains reset. Both the counters 831 and 832 remain reset until the scan-command from the central controller 10 are received.

When the flip-flop 821 is set, the decoder 841 becomes active, the scan-command signal appears only on the output ① of the decoder 841 since the counter 831 is reset, thus the drive circuit 3 in FIG. 1 begins to drive the scanning driver line $1s_1$. As a result, the information concerning the turning ON and OFF of the $m$ scanning points 111 to 11m in the scanning drive line $1s_1$ is defined in the sense-amplifiers 6 through the respective noise-eliminating filters 5.

On the other hand, when the flip-flop 820 in FIG. 2 is set, the counter 832 begins to count an output of the timing generator 86. When the counter 832 counts 12 times of the cycle of the output of the timing generator 86, a signal for driving the memory interface 85 is generated. By means of this signal, the memory interface 85 begins to reset the counter 832 as well as to prepare to transmit the information concerning the turning ON and OFF of the scanning points 111 to 11m to the memory 9. The address of the memory 9 is made by the output of the counter 831 and the outputs of the flip-flops 821 and 822 and the definition of the information of the scanning points which is transmitted to the memory 9 is carried out by sending the strobe 7 to the sense-amplifier 6. The means of transmitting to the memory 9 can be easily obtained from the known art.

After the memory interface 85 transmits the information concerning the scanning points to the memory 9, the reset of the counter 832 is released and the counter 832 begins to count again and advances the counter 831 by one. As a result, the signal disappears on the output ① of the decoder 841 and it appears newly the signal on the output ② thereof and thus the pertinent driver is driven to scan scanning points 121 - 12m (not shown). The subsequent operation is the same as the case of the scanning point 111 - 11m. These operations are reiterated until the information on last scanning points of the submatrix 1, i.e., the scanning points accomodated in a 16th scanning driver line thereof are transmitted to the memory 9.

After the information on the last scanning points has been transmitted to the memory 9, however, all the components in the scanning controller are reset in such a state as are about to receive the next scan-command. The scanning controller is reset in the following manner as seen from the figure.

All of the outputs of counter 831 are "1" while the last scanning points are scanned. Namely, the output of the AND gate 871 is "1". In this state, when the counter 832 counts a signal for driving the memory interface 85, this memory interface 85 outputs a signal for resetting the counter 832. As a result, a logical product at the AND gate 872 is obtained from this resetting signal and the output of the AND gate 871, and thus flip-flop's 820 to 822 are reset.

When the memory interface 9 releases the resetting of the counter 2, that is, after the information on the last scanning points in the submatrix 1 is transmitted to the memory 9, the counter 831 is advanced to be reset.

The central controller 10 issues to the scanning controller scanning commands in steps with the respective scanning cycles associated with the scanning points included in the submatrix 1, so that after issuance of the commands, the central controller 10 leaves the scanning operation to the scanning controller 8 thereby to concentrate on jobs other the scanning. After all the information of the scanning points included in the submatrix 1 is stored in the memory 9, the central controller 10 has access to the memory 9 thereby to acknowledge and utilize the conditions of the scanning points.

As to the submatrix 2, on the other hand, central controller 10 issues to the scanning controller 8 a command to scan the submatrix 2 during the time period when the submatrix 1 is not being scanned, since the submatrix 2 contains the scanning points 211 to 21m which may be scanned in a long cycle or non-cyclic way. A similar operation for controlling the submatrix 1 applies to the control operation of the scanning controller 8 in scanning the scanning points 211 to 21m accomodated in submatrix 2.

Even though the above-mentioned embodiment refers to a case in which the scanning points to be scanned are divided into a couple of submatrices in such a manner that one of them contains those scanning points requiring the scanning in a short cycle, the submatrix containing the scanning points associated with a short scanning cycle may also include scanning points scannable in a long cycle.

In the case where a greater number of scanning points are involved as in the embodiment shown in FIG. 2, the matrix may be divided into submatrices in the number of $n$ which is 3 or more.

Figure 3:
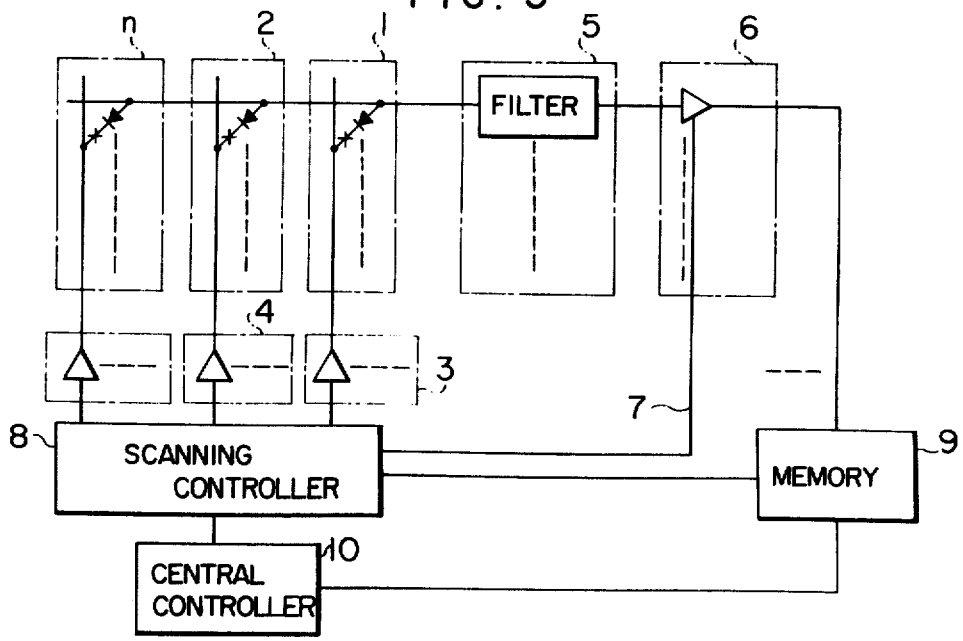
FIG. 3 is a block diagram showing the second embodiment of the present invention.

Further, as shown in FIG. 3, a plurality of scanning controllers and memories except the central controller may be provided in order to make provisions for an increased number of scanning points and assure improved reliability.

Figure 4:
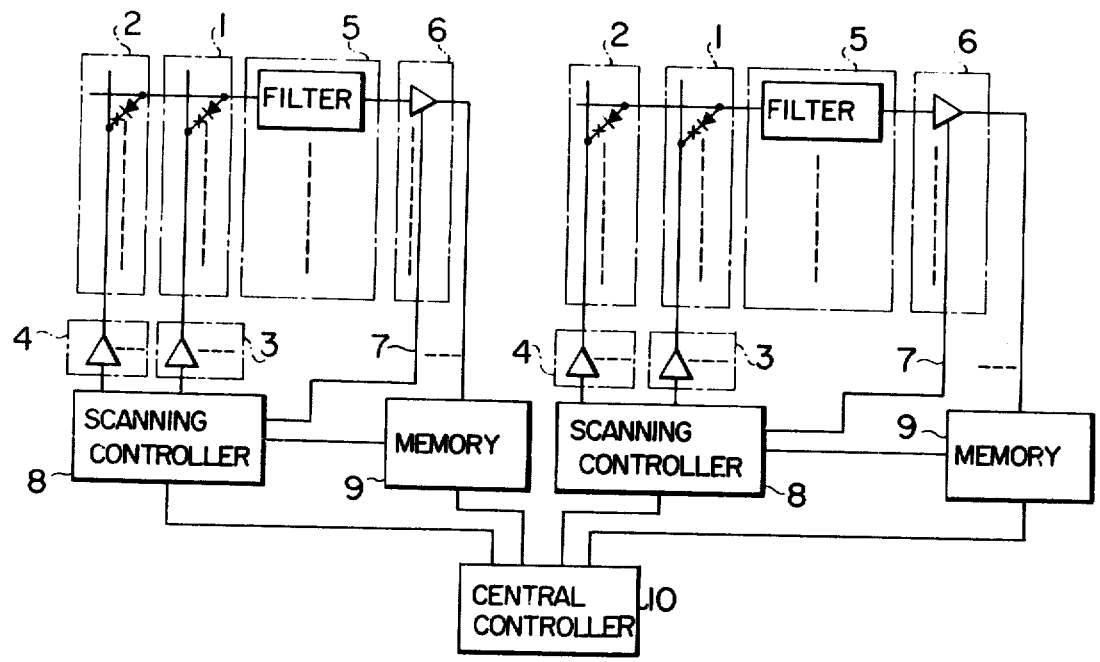
FIG. 4 is a block diagram showing the third embodiment of the present invention.
Figure 5:
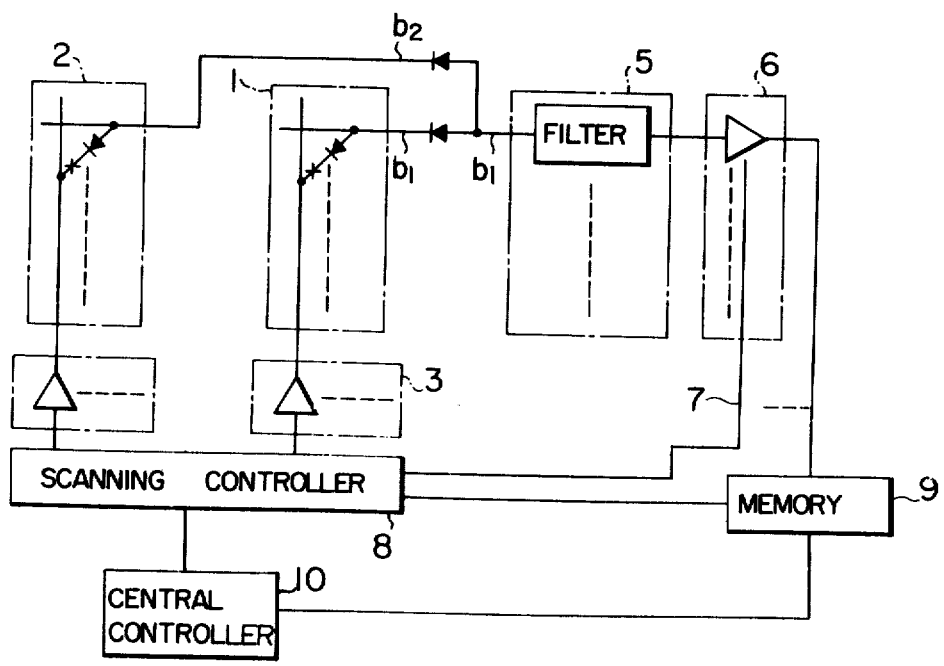
FIG. 5 is a block diagram showing the fourth embodiment of the present invention.

Furthermore, with reference to a further embodiment of the invention shown in FIG. 4, the reliability of the device may be improved by dividing the bus $b_1$ into a couple of branches $b_1$ and $b_2$ for submatrices 1 and 2 respectively so that at least one of them is available for use even in the case of breakdown of the other. The arrangements of FIGS. 2 and 3 may be combined as desired.

The aforementioned embodiments are based on the assumption that the scanning controller begins its scanning operation at the first column of each of the submatrices. But an arrangement is possible in which the central controller issues commands to the scanning controller as to a particular column at which the scanning is to be begun or as to the number of columns to be scanned.

It will be understood from the above description that according to the present invention the actual scanning is effected by the scanning controller 8 upon the commands issued by the central controller 10 and therefore the central controller 10 is capable of taking full advantage of the scanning information stored in the memory 9 for an improved scanning efficiency. Also, the fact that the bus scanning system which can disregard any time delay caused by the noise-eliminating filters 5 permits the use of scanning amplifiers comprising low-cost integrated circuits. Furthermore, stronger protection of the system from noise carried on the buses and scanning drive lines makes it unnecessary to make special provisions for wiring, resulting in a low-cost system arrangement.

We claim:
1. A scanning system comprising:
    a. a scanning matrix including a multiplicity of columns and rows and points to be scanned, each of said points being connected to each of the intersections of said columns and rows;
    b. a plurality of scanning drive circuits connected to said columns of said scanning matrix, respectively:
    c. a plurality of read means connected to the rows of said scanning matrix;
    d. a memory connected to said plurality of read means; and
    e. a scanning controller for energizing said scanning drive circuits successively and storing in appropriate addresses of said memory signals produced from said plurality of read means, respectively.
2. A scanning system according to claim 1, in which said matrix comprises a plurality of submatrices with different scanning cycles and said scanning controller scans each submatrix in each scanning cycle associated with said each matrix.

* * * * *